United States Patent
Hu et al.

(10) Patent No.: US 10,998,219 B2
(45) Date of Patent: May 4, 2021

(54) WAFER SUPPORT DEVICE AND METHOD FOR REMOVING LIFT PIN THEREFROM

(71) Applicant: TAIWAN SEMICONDUCTOR MANUFACTURING CO., LTD., Hsinchu (TW)

(72) Inventors: Zong-Han Hu, Nantou County (TW); Yu-Shan Shih, Taichung (TW); Chen-Liang Chang, New Taipei (TW); Chin-Szu Lee, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 650 days.

(21) Appl. No.: 15/180,247

(22) Filed: Jun. 13, 2016

(65) Prior Publication Data

US 2017/0358474 A1 Dec. 14, 2017

(51) Int. Cl.
*H01L 21/687* (2006.01)
*B23B 31/28* (2006.01)
*H01L 21/683* (2006.01)

(52) U.S. Cl.
CPC ........ *H01L 21/68742* (2013.01); *B23B 31/28* (2013.01); *H01L 21/6831* (2013.01); *H01L 21/6833* (2013.01); *Y10T 279/23* (2015.01)

(58) Field of Classification Search
CPC .. B23B 31/28; H01L 21/68742; Y10T 279/23
See application file for complete search history.

(56) References Cited

U.S. PATENT DOCUMENTS

| 4,603,597 | A | * | 8/1986 | Onorati | F16D 1/06 403/326 |
| 5,708,556 | A | * | 1/1998 | van Os | C23C 16/4586 361/234 |
| 5,900,062 | A | * | 5/1999 | Loewenhardt | H01L 21/6831 118/715 |
| 6,435,798 | B1 | * | 8/2002 | Satoh | C23C 16/4586 118/728 |
| 6,938,505 | B2 | * | 9/2005 | Chen | H01L 21/67259 414/935 |
| 7,750,818 | B2 | * | 7/2010 | Lee | H01L 21/67259 340/686.1 |
| 9,921,490 | B2 | * | 3/2018 | Shibazaki | H01L 21/68742 |
| 2003/0205329 | A1 | * | 11/2003 | Gujer | C23C 16/405 156/345.51 |
| 2005/0092438 | A1 | * | 5/2005 | Hur | H01L 21/68742 156/345.47 |
| 2006/0016398 | A1 | * | 1/2006 | Dubost | C23C 16/4586 118/728 |

(Continued)

*Primary Examiner* — Eric A. Gates
*Assistant Examiner* — Chwen-Wei Su
(74) *Attorney, Agent, or Firm* — McClure, Qualey & Rodack, LLP

(57) ABSTRACT

A wafer support device includes a susceptor, at least one lift pin, at least one lift pin support base and at least one pad. The susceptor has a bottom surface and a top surface configured to support a wafer. The susceptor has at least one through hole extending between the bottom surface and the top surface. The lift pin is at least partially telescopically received in the through hole of the susceptor. The lift pin support base has at least one coupling feature thereon. The pad is detachably coupled with the coupling feature and supports the lift pin.

20 Claims, 7 Drawing Sheets

(56) References Cited

U.S. PATENT DOCUMENTS

| | | | |
|---|---|---|---|
| 2007/0212200 A1* | 9/2007 | Ueda | H01L 21/68742 414/217 |
| 2011/0222038 A1* | 9/2011 | Yamashita | C23C 16/4581 355/53 |
| 2014/0265098 A1* | 9/2014 | Himmelsbach | H01L 21/68742 269/54.4 |

* cited by examiner

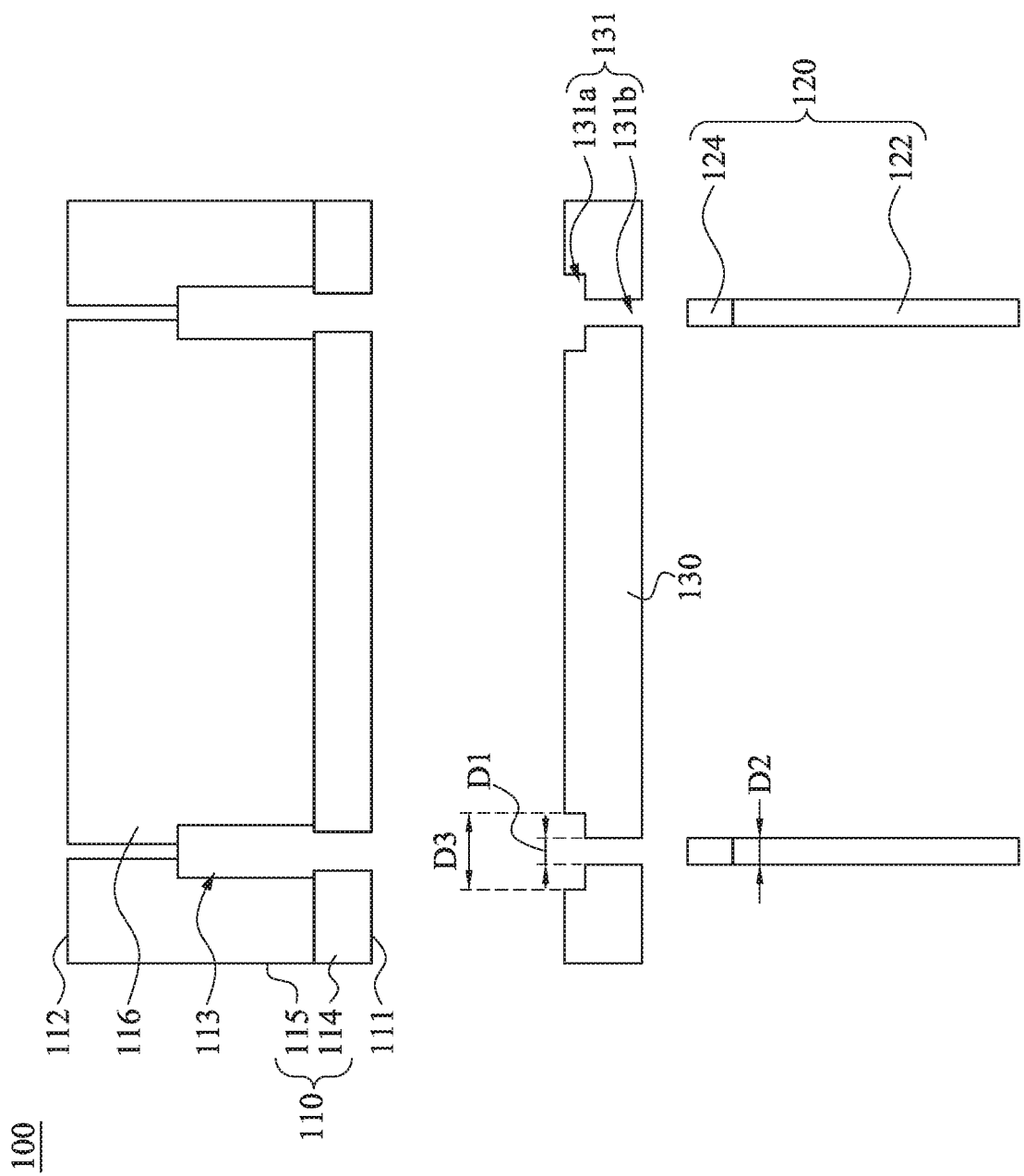

WAFER SUPPORT DEVICE AND METHOD FOR REMOVING LIFT PIN THEREFROM

BACKGROUND

In the semiconductor manufacturing industry, various processes such as etching, deposition, implantation and lithography patterning are applied to a semiconductor wafer to form a designed circuit and interconnection. In practice, the processes applied to the semiconductor wafer are carried out in a processing chamber. In order to hold the semiconductor wafer in the processing chamber in a proper position, an electrostatic chuck (e-chuck) is utilized to secure the semiconductor wafer electrostatically.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-7 are schematic views of the sequence of removing the lift pins from the wafer support device of FIG. 1.

DETAILED DESCRIPTION

Figure 1:
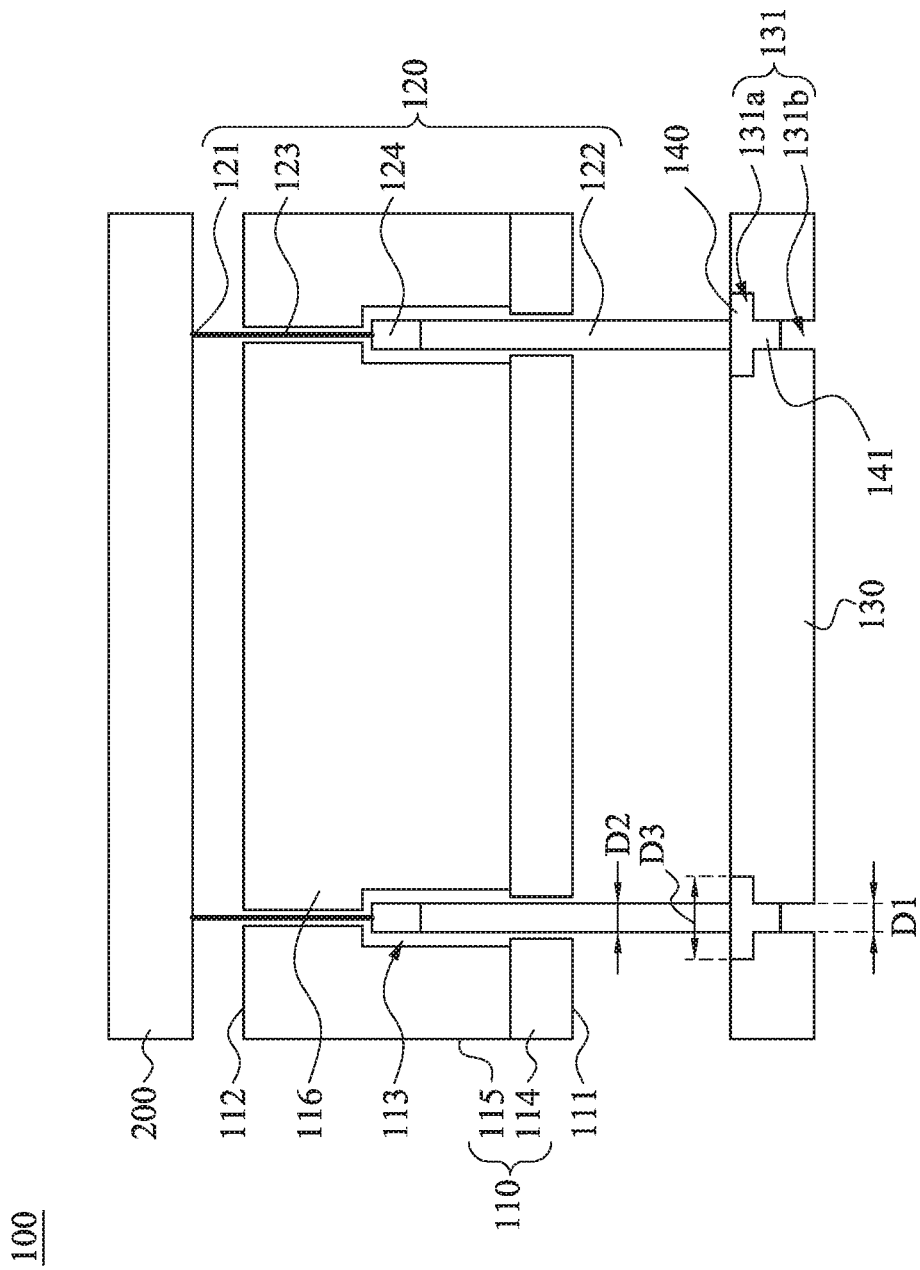
FIG. 1 is a schematic view of a wafer support device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1. FIG. 1 is a schematic view of a wafer support device 100 in accordance with some embodiments of the present disclosure. As shown in FIG. 1, a wafer support device 100 includes a susceptor 110, at least one lift pin 120, at least one lift pin support base 130 and at least one pad 140. The susceptor 110 has a bottom surface 111 and a top surface 112 opposite to each other. The susceptor 110 is configured to support a wafer 200 on the top surface 112. The susceptor 110 has at least one through hole 113 extending between the bottom surface 111 and the top surface 112. The lift pin 120 is at least partially telescopically received in the through hole 113 of the susceptor 110. The lift pin support base 130 has at least one coupling feature 131 thereon. The pad 140 is detachably coupled with the coupling feature 131 of the lift pin support base 130. The pad 140 supports the lift pin 120.

During the operation of the wafer support device 100, as shown in FIG. 1, the lift pin 120 as supported by the pad 140 is pushed up by the lift pin support base 130 such that at least a part of the lift pin 120 protrudes from the top surface 112 of the susceptor 110. In some embodiments, the quantity of the lift pin 120 is plural and the wafer 200 is supported by the lift pins 120 practically. Since the wafer 200 is supported by the tips 121 of the lift pins 120, the positioning of the wafer 200 relative to the wafer support device 100 is convenient and easy.

Figure 2:
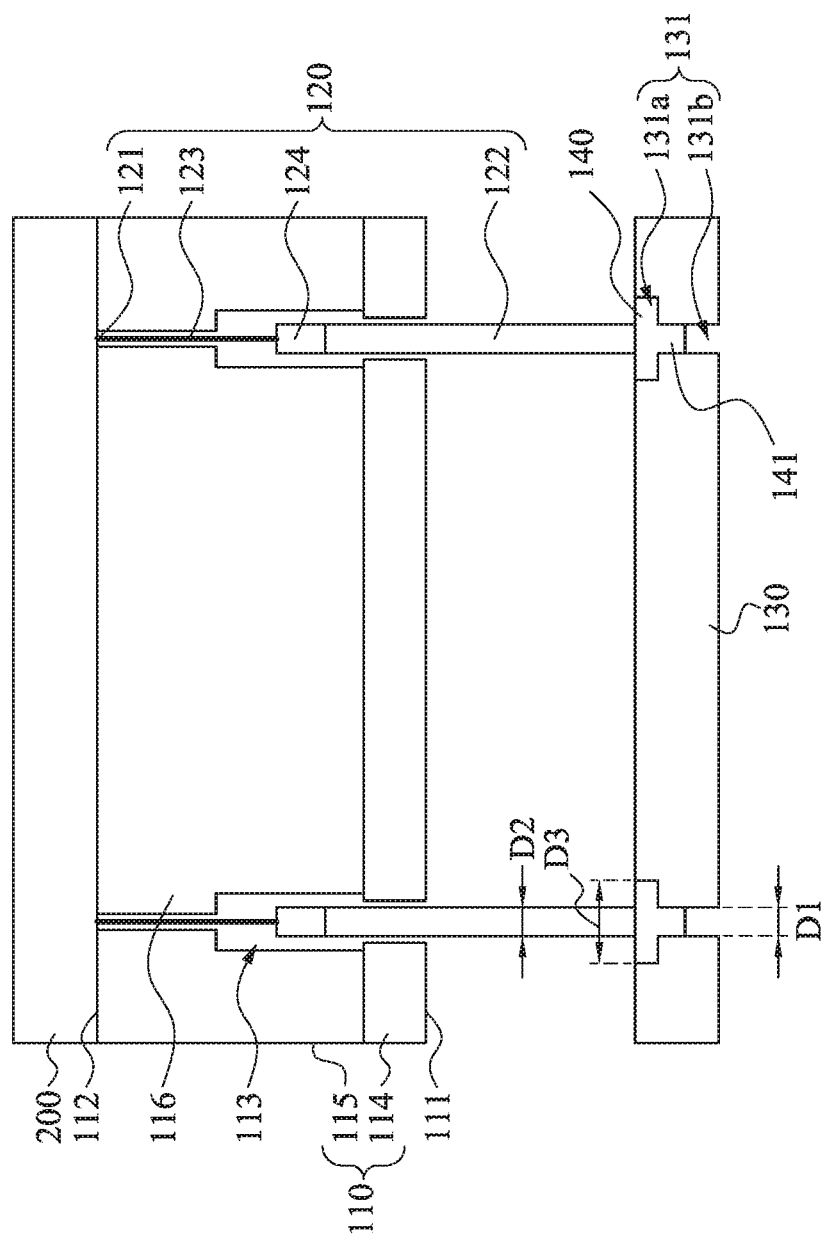
FIG. 2 is a schematic view of the wafer support device of FIG. 1, in which the wafer is supported on the susceptor.

Reference is made to FIG. 2. FIG. 2 is a schematic view of the wafer support device 100 of FIG. 1, in which the wafer 200 is supported on the susceptor 110. As shown in FIG. 2, after the wafer 200 is supported by the lift pins 120 properly, the lift pin support base 130 is moved away from the susceptor 110. Since each of the lift pins 120 is supported by the corresponding pad 140, and each of the pads 140 is coupled with the corresponding coupling feature 131 of the lift pin support base 130 as mentioned above, the lift pins 120 move together with the lift pin support base 130. In this way, the tip 121 of each of the lift pins 120 become substantially located inside the corresponding through hole 113 of the susceptor 110. This means that the lift pins 120 are no longer protruding from the top surface 112 of the susceptor 110. In other words, the wafer 200 is no longer supported by the tips 121 of the lift pins 120. Instead, the wafer 200 is supported on the top surface 112 of the susceptor 110.

In a nutshell, as a sequence to place the wafer 200 on the susceptor 110 of the wafer support device 100, the wafer 200 is first placed on the lift pins 120 protruding from the top surface 112 of the susceptor 110 as shown in FIG. 1. To be more exact, the wafer 200 is first placed on the tips 121 of the lift pins 120 while the lift pins 120 are protruding from the top surface 112 of the susceptor 110. Afterwards, with the movement of the lift pin support base 130 away from the susceptor 110, the lift pins 120 move together with the lift pin support base 130 as the lift pins 120 are supported by the pads 140 coupled with the coupling feature 131 of the lift pin support base 130. In this way, the part of each of the lift pins 120 originally protruding from the top surface 112 of the susceptor 110 moves into the corresponding through hole 113 of the susceptor 110 as shown in FIG. 2. As a result, the wafer 200 is no longer supported by the tips 121 of the lift pins 120. Instead, the wafer 200 is supported on the top surface 112 of the susceptor 110. Hence, the sequence to place the wafer 200 on the top surface 112 of the susceptor 110 of the wafer support device 100 is completed.

To be more specific, in practical applications, each of the pads 140 is toollessly coupled with the corresponding coupling feature 131 of the lift pin support base 130. This means that each of the pads 140 is coupled with the corresponding coupling feature 131 of the lift pin support base 130 without the use of any tool. In simple words, each of the pads 140 can be coupled with the corresponding coupling feature 131 of the lift pin support base 130 or released from the corresponding coupling feature 131 of lift pin support base 130 conveniently by a bare hand.

In some embodiments, the coupling feature 131 is a through hole. In other words, the lift pin support base 130 has at least one through hole therein. In some embodiments, the coupling feature 131 as the through hole of the lift pin support base 130 and the corresponding through hole 113 of the susceptor 110 at least partially vertically overlap with each other. This means that the coupling feature 131 as the through hole and the corresponding through hole 113 have substantially the same center line. Since each of the pads 140 is toollessly coupled with the corresponding coupling feature 131 as the through hole of the lift pin support base 130 as mentioned above, each of the pads 140 detachably and toollessly covers the corresponding coupling feature 131 as the through hole of the lift pin support base 130 accordingly.

As shown in FIGS. 1-2, each of the coupling features 131 as the through hole of the lift pin support base 130 has a diameter D1. For instance, the diameter D1 of each of the coupling features 131 as the through hole can be in a range from about 8.7 mm to about 9.1 mm. The diameter D1 of each of the coupling features 131 as the through hole is substantially equal to or greater than a diameter D2 of the corresponding lift pin 120. For instance, the diameter D2 of each of the lift pin 120 can be in a range from about 8.5 mm to about 8.7 mm. As a result, each of the lift pins 120 is able to pass through the corresponding coupling feature 131 as the through hole of the lift pin support base 130. Therefore, in case the pads 140 are removed from the coupling features 131 as the through holes, the corresponding lift pins 120 can be moved away from the susceptor 110 through the coupling features 131 as the through holes in the lift pin support base 130. Furthermore, this means that the replacement of the lift pins 120 can be conveniently carried out without the disassembly of the susceptor 110.

To be more specific, in some embodiments, each of the coupling features 131 as the through hole of the lift pin support base 130 has a top portion 131a and a bottom portion 131b. The top portion 131a is present between the susceptor 110 and the corresponding bottom portion 131b. Each of the top portions 131a has a diameter D3. For instance, the diameter D3 of each of the top portions 131a can be in a range from about 14.0 mm to about 15.8 mm. The bottom portion 131b has the diameter D1 of the coupling feature 131 as the through hole. As mentioned above, the diameter D1 is substantially equal to or greater than the diameter D2 of each of the lift pins 120. To be exact, the diameter D1 of the bottom portion 131b of each of the through holes is substantially equal to or greater than the diameter D2 of the corresponding lift pin 120. In other words, each of the lift pins 120 is able to pass through the bottom portion 131b of the corresponding coupling features 131 as the through hole. Furthermore, the diameter D3 of each of the top portions 131a is greater than that the diameter D1 of the corresponding bottom portion 131b, and each of the portions 131a is configured to toollessly couple with the corresponding pad 140.

As mentioned above, each of the pads 140 is detachably coupled with the corresponding coupling feature 131 of the lift pin support base 130. To be more exact, each of the pads 140 is at least partially received in the top portion 131a of the corresponding coupling feature 131 as the through hole. In addition, each of the pads 140 can be put in the corresponding top portion 131a or removed from the corresponding top portion 131a without the use of any tool.

In some embodiments, the coupling feature 131 is a recess in the lift pin support base 130. Meanwhile, each of the pads 140 is at least partially received in the corresponding recess, such that each of the pads 140 is toollessly coupled with the corresponding recess of the lift pin support base 130 without the use of any tool.

Furthermore, the recess has at least one positioning hole therein. The positioning hole can be regarded as the bottom portion 131b as mentioned above. In some embodiments, the positioning hole at least partially passes through the lift pin support base 130. Correspondingly, each of the pads 140 has at least one positioning pin 141 and the positioning pin 141 is received in the corresponding positioning hole of the recess. Thus, by the arrangement of each of the positioning pins 141 in the position hole of the corresponding recess, the pads 140 are received in the coupling features 131 as the recesses in a stable manner.

In addition, in some embodiments, the positioning hole of each of the coupling features 131 as the recess is sized to allow at least the lift pin rod 122 of the corresponding lift pin 120 to pass therethrough. In other words, lift pin rod 122 of each of the lift pins 120 is able to pass through the corresponding coupling feature 131 as the recess with the positioning hole of the lift pin support base 130.

To be more specific, the positioning hole of each of the coupling features 131 as the recess is further sized to allow at least the lift pin holder 124 to pass therethrough. In other words, the lift pin rod 122 with the lift pin holder 124 of each of the lift pins 120 is able to pass through the corresponding coupling feature 131 as the recess with the positioning hole of the lift pin support base 130 together. Therefore, in case the pads 140 are removed from the coupling features 131 as the recesses, the lift pin rods 122 with the corresponding lift pin holders 124 can be moved away from the susceptor 110 through the coupling features 131 as the recesses with the positioning holes in the lift pin support base 130.

Structurally speaking, as shown in FIGS. 1-2, each of the lift pins 120 includes at least one lift pin rod 122, at least one lift pin body 123 and at least one lift pin holder 124. Each of the lift pin holder 124 detachably connects the corresponding lift pin body 123 to the corresponding lift pin rod 122. This means that either one of the lift pin holder 124, the lift pin body 123 or the lift pin rod 122 of each of the lift pins 120 can be detached for replacement. In practical applications, the lift pin body 123 is configured to contact with the wafer 200. In addition, each of the tips 121 as mentioned above is located at an end of the corresponding pin body 123 away from the corresponding lift pin holder 124.

In some embodiments, the coupling feature 131 is a spot-faced aperture in the lift pin support base 130. Meanwhile, each of the pads 140 is at least partially received in the corresponding spot-faced aperture, such that each of the pads 140 is toollessly coupled with the corresponding spot-faced aperture of the lift pin support base 130. Moreover, each of the coupling features 131 as the spot-faced aperture is sized to allow at least the lift pin rod 122 of the corresponding lift pin 120 to pass therethrough. In other words, the lift pin rod 122 of each of the lift pins 120 is able to pass through the corresponding coupling feature 131 as the spot-faced aperture of the lift pin support base 130.

To be more specific, each of the coupling features 131 as the spot-faced aperture is further sized to allow at least the lift pin holder 124 to pass therethrough. In other words, the lift pin rod 122 with the lift pin holder 124 of each of the lift pins 120 is able to pass through the corresponding coupling feature 131 as the spot-faced aperture of the lift pin support base 130 together. Therefore, in case the pads 140 are removed from the coupling features 131 as the spot-faced apertures, the lift pin rods 122 with the corresponding lift pin holders 124 can be moved away from the susceptor 110 through the coupling features 131 as the spot-faced apertures in the lift pin support base 130.

On the other hand, as shown in FIGS. 1-2, the susceptor 110 includes a supporting pate 114 and an electrostatic chuck (e-chuck) 115. The electrostatic chuck 115 is present on the supporting pate 114. The through hole 113 of the susceptor 110 extends through the supporting pate 114 and the electrostatic chuck 115. In other words, the top surface 112 is located on the electrostatic chuck 115 while the bottom surface 111 is located on the supporting pate 114. When the wafer 200 is placed on the wafer support device 100 for consequent procedures, the wafer 200 is placed on the top surface 112 of the electrostatic chuck 115. In some embodiments, the electrostatic chuck 115 has at least one cathode 116 therein.

Figure 3:
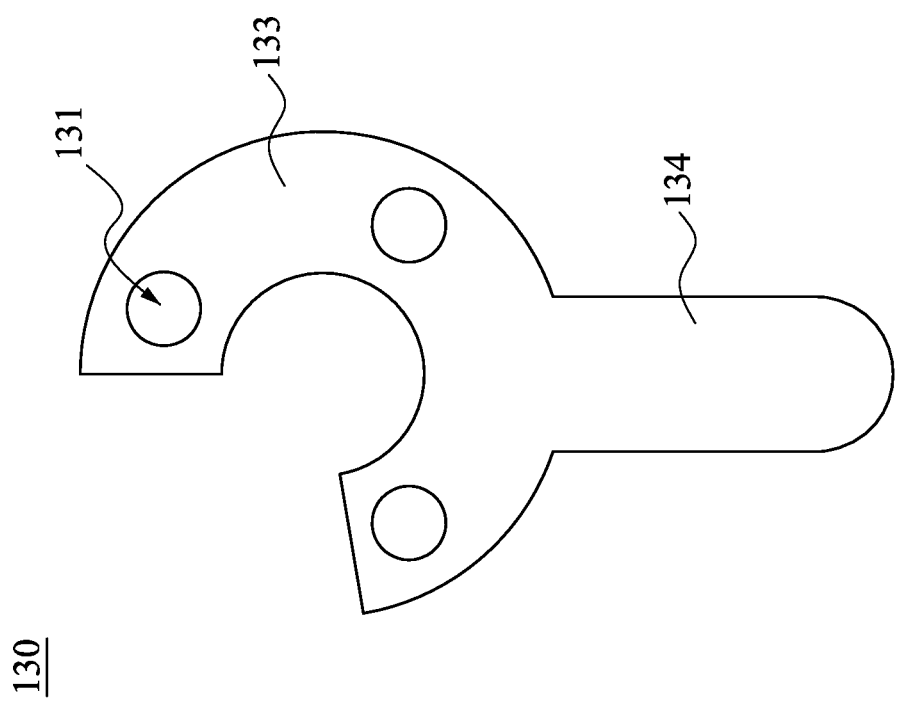
FIG. 3 is a top view of the lift pin support base of FIG. 1.

Reference is made to FIG. 3. FIG. 3 is a top view of the lift pin support base 130 of FIG. 1. As shown in FIG. 3, the lift pin support base 130 includes a ring portion 133 and a handle portion 134. The ring portion 133 is in a C shape. The C shape of the ring portion 133 helps to improve the convenience to place the ring portion 133 from sideways to the proper position under the susceptor 110. Moreover, the coupling feature 131 is present on the side of the ring portion 133 facing the susceptor 110. This means that each of the pads 140 is detachably coupled with the corresponding coupling feature 131 on the ring portion 133. In addition, the handle portion 134 is connected to the ring portion 133. Thus, by holding and moving the handle portion 134, the lift pin support base 130 can be moved near to or away from the susceptor 110 in the process to place the wafer 200 on the top surface 112 of the susceptor 110 of the wafer support device 100.

With reference to the wafer support device 100 as mentioned above, the embodiments of the present disclosure further provide a method for removing the lift pin 120 from the wafer support device 100. The method includes the following steps (it is appreciated that the sequence of the steps and the sub-steps as mentioned below, unless otherwise specified, all can be adjusted according to the actual situations, or even executed at the same time or partially at the same time):

(1) removing the pad 140 from the coupling feature 131 as the through hole of the lift pin support base 130, in which the susceptor 110 is present above the lift pin support base 130.

(2) removing at least a part of the lift pin 120 from the wafer support device 100 through the through hole of the lift pin support base 130.

In details, after the pads 140 are removed from the coupling features 131 as the through holes of the lift pin support base 130, each of the through holes is then opened to the corresponding lift pin 120. In other words, without disassembling the electrostatic chuck 115 from the supporting pate 114 of the susceptor 110, each of the lift pins 120 can be removed from the wafer support device 100 through the corresponding coupling feature 131 as the through hole of the lift pin support base 130 in a convenient way. As mentioned above, each of the lift pins 120 includes at least one lift pin rod 122, at least one lift pin body 123 and at least one lift pin holder 124. The lift pin holder 124 detachably connects the lift pin body 123 to the lift pin rod 122. As a result, the replacement of each of the lift pin holder 124 of the corresponding lift pin 120 can be carried out in a simple and easy way.

To be more specific, the step of removing the lift pin 120 includes the following sub-steps:

(2.1) lifting the lift pin 120, such that the lift pin body 123 of the lift pin 120 at least partially extends out of the through hole 113 of the susceptor 110.

(2.2) removing the lift pin body 123 from the lift pin holder 124.

(2.3) removing at least the lift pin rod 122 through the coupling features 131 as the through hole of the lift pin support base 130.

Figure 4:
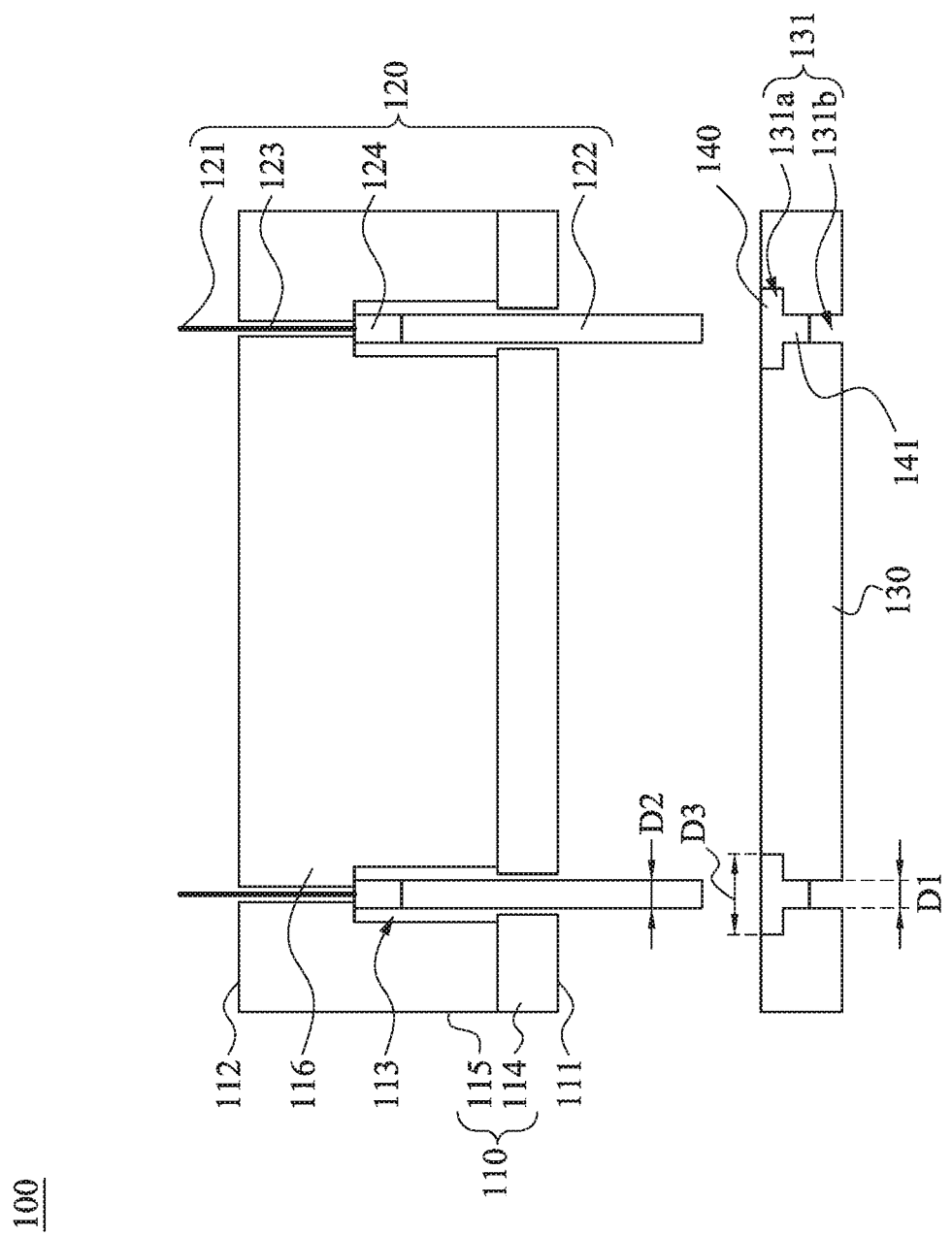

Reference is made to FIGS. 4-7. FIGS. 4-7 are schematic views of the sequence of removing the lift pins 120 from the wafer support device 100 of FIG. 1. As shown in FIG. 4, the lift pins 120 are lifted up and moved away from the lift pin support base 130. In this way, at least a part of each of the lift pins 120 is protruding out of the top surface 112 of the susceptor 110. To be more exact, the lift pin body 123 of each of the lift pins 120 at least partially extends out of through hole 113 of the susceptor 110. At this point, the lift pin body 123 of each of the lift pins 120 is ready to be detached from the corresponding lift pin holder 124.

Figure 5:
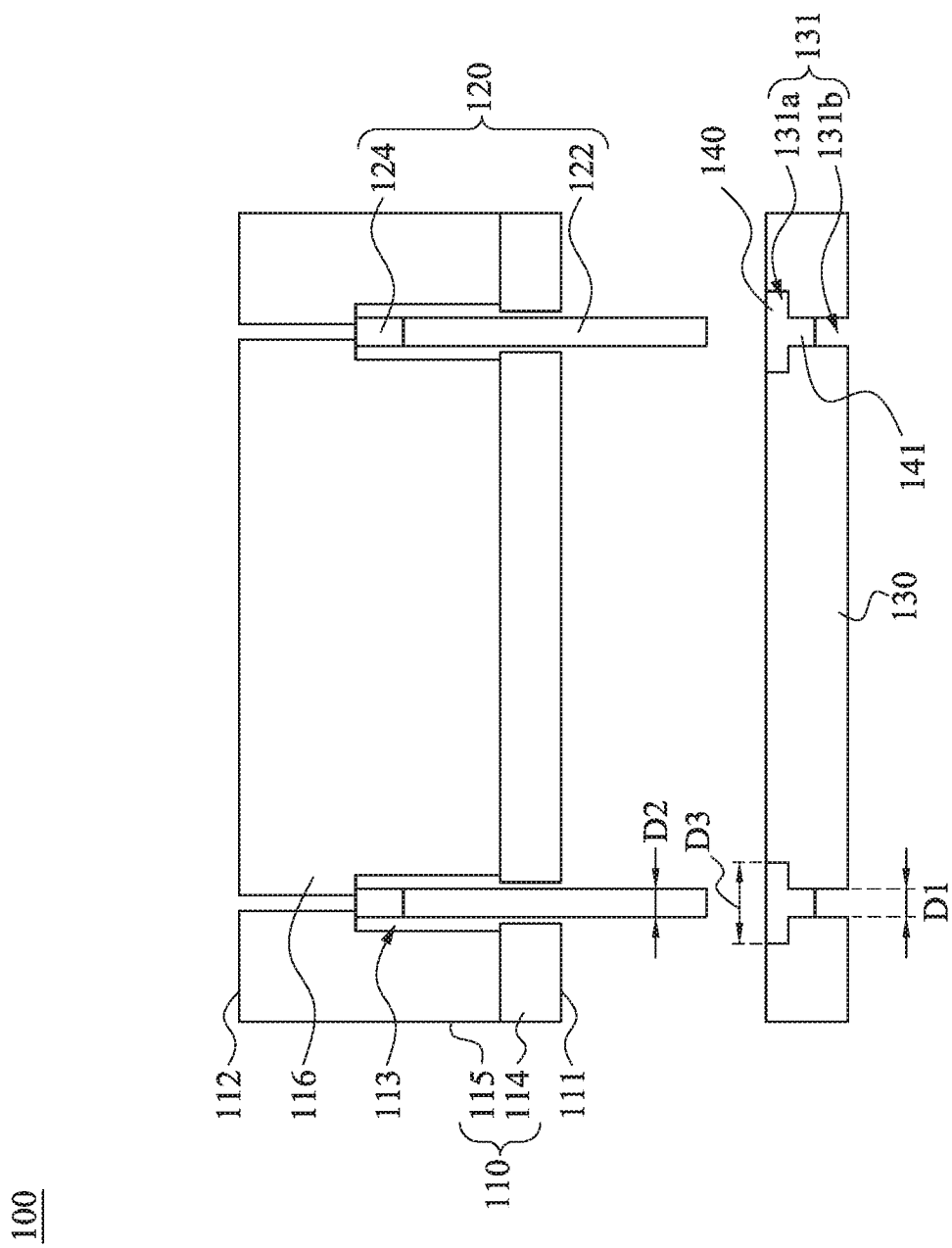

As shown in FIG. 5, each of the lift pin rods 122 is detached and removed from the corresponding lift pin holder 124 through the top surface 112 of the susceptor 110, i.e., through the top surface 112 of the electrostatic chuck 115. At the same time, since the lift pins 120 are lifted up and moved away from the lift pin support base 130, a space between the lift pin rod 122 of each of the lift pins 120 and the corresponding pad 140 is formed.

Figure 6:
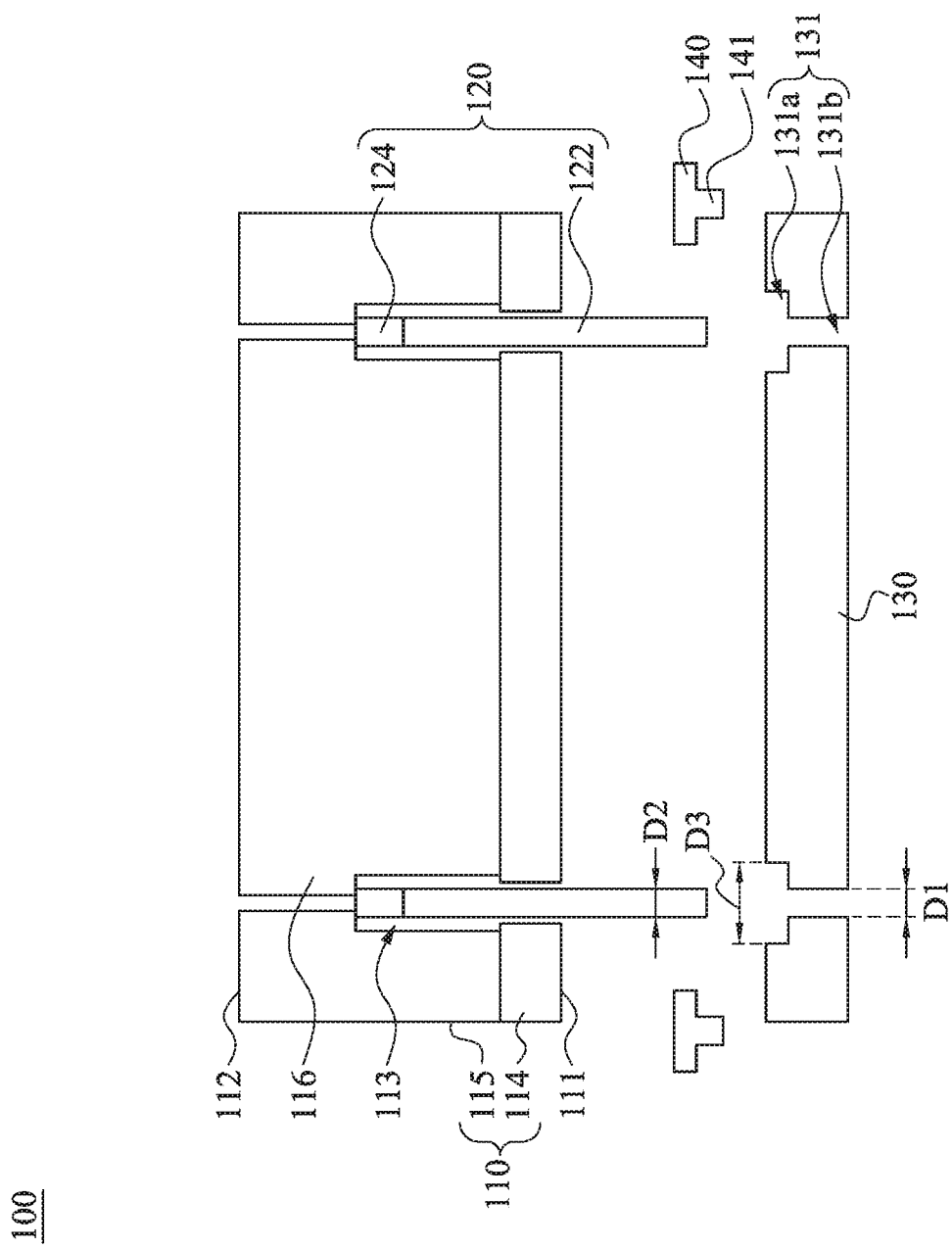

As shown in FIG. 6, since the space is formed between the lift pin rod 122 of each of the lift pins 120 and the corresponding pad 140, the corresponding pad 140 can be moved into the space and away from the lift pin support base 130. As mentioned above, each of the pads 140 is toollessly coupled with the corresponding coupling feature 131 of the lift pin support base 130. Thus, each of the pads 140 is removed from the corresponding coupling feature 131 of the lift pin support base 130 toollessly. Consequently, each of the coupling features 131 as the through hole of the lift pin support base 130 is opened to the corresponding lift pin 120.

Furthermore, the step of removing the lift pin 120 includes:

(2.4) lowering at least said part of the lift pin 120 through the corresponding coupling feature 131 as the through hole of the lift pin support base 130.

As shown in FIG. 7, since each of the coupling features 131 as the through hole of the lift pin support base 130 is opened to the corresponding lift pin 120, the corresponding lift pin 120 can be lowered through the corresponding coupling feature 131 as the through hole of the lift pin support base 130. In other words, without disassembling the electrostatic chuck 115 from the supporting pate 114 of the susceptor 110, each of the lift pins 120 can be removed from the wafer support device 100 through the corresponding coupling feature 131 as the through hole of the lift pin support base 130 in a convenient way.

To be more specific, the step of removing the lift pin rod 122 removes the lift pin rod 122 with the lift pin holder 124 together through the corresponding coupling feature 131 as the through hole of the lift pin support base 130. Furthermore, since each of the lift pin holders 124 can be detached from the corresponding lift pin rod 122, the replacement of the lift pin holder 124 of each of the lift pins 120 can be carried out in a simple and easy way without the disassembly of the electrostatic chuck 115 from the supporting pate 114 of the susceptor 110.

According to various embodiments of the present disclosure, the diameter of each of the coupling features as the through hole is substantially equal to or greater than the diameter of the corresponding lift pin. As a result, each of the lift pins is able to pass through the corresponding coupling feature as the through hole of the lift pin support base. Therefore, in case the pads are removed from the coupling features as the through holes, the corresponding lift pins can be moved away from the susceptor through the coupling features as the through holes in the lift pin support base. Furthermore, this means that the replacement of the lift pins can be conveniently carried out without the disassembly of the susceptor.

According to various embodiments of the present disclosure, the wafer support device includes the susceptor, the lift pin, the lift pin support base and the pad. The susceptor has the bottom surface and the top surface configured to support a wafer. The susceptor has the through hole extending between the bottom surface and the top surface. The lift pin is at least partially telescopically received in the through hole of the susceptor. The lift pin support base has the coupling feature thereon. The pad is detachably coupled with the coupling feature and supports the lift pin.

According to various embodiments of the present disclosure, the wafer support device includes the susceptor, the lift pin, the lift pin support base and the pad. The susceptor has the bottom surface and the top surface configured to support the wafer. The susceptor has the through hole extending between the bottom surface and the top surface. The lift pin is at least partially telescopically received in the through hole of the susceptor. The lift pin support base has the through hole therein, in where the through hole of the lift pin support base and the through hole of the susceptor at least partially vertically overlap with each other. The pad detachably covers the through hole of the lift pin support base.

According to various embodiments of the present disclosure, the method for removing the lift pin from the wafer support device is provided. The method includes removing the pad from the through hole of the lift pin support base, in where the susceptor is present above the lift pin support base, the susceptor has the through hole, the lift pin is at least partially telescopically received in the through hole of the susceptor, and removing at least a part of the lift pin from the wafer support device through the through hole of the lift pin support base.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer support device, comprising:
   a susceptor having a bottom surface and a top surface configured to support a wafer, the susceptor having at least one through hole extending between the bottom surface and the top surface, wherein the through hole includes a first end portion and a second end portion that is above the first end portion and that has a width less than a width of the first end portion;
   at least one lift pin at least partially telescopically received in the through hole of the susceptor and having a width greater than the width of the second end portion of the through hole of the susceptor, wherein the lift pin comprises at least one lift pin rod, at least one lift pin body, and at least one lift pin holder detachably connecting the lift pin body to the lift pin rod;
   at least one lift pin support base having at least one coupling feature thereon; and
   at least one pad detachably coupled with the coupling feature and supporting the lift pin, wherein a topmost surface of the pad is inside the coupling feature and the coupling feature is sized to allow the lift pin rod, the lift pin body, and the lift pin holder to pass therethrough.

2. The wafer support device of claim 1, wherein the pad is toollessly coupled with the coupling feature.

3. The wafer support device of claim 1, wherein the coupling feature is a recess in the lift pin support base, and the topmost surface of the pad is received in the recess.

4. The wafer support device of claim 3, wherein the recess has at least one positioning hole therein, and the pad has at least one positioning pin received in the positioning hole.

5. The wafer support device of claim 1, wherein the coupling feature is a spot-faced aperture, and the spot-faced aperture is sized to allow at least the lift pin rod to pass therethrough.

6. The wafer support device of claim 1, wherein the coupling feature is a spot-faced aperture, and the spot-faced aperture is sized to allow at least the lift pin rod with the lift pin holder to pass therethrough.

7. The wafer support device of claim 1, wherein the lift pin support base comprises:
   a ring portion in a C shape, the coupling feature present on the ring portion; and
   a handle portion connected to the ring portion.

8. The wafer support device of claim 1, wherein the susceptor comprises:
   a supporting pate; and
   an electrostatic chuck present on the supporting pate, wherein the through hole extends through the supporting pate and the electrostatic chuck.

9. The wafer support device of claim 8, wherein the electrostatic chuck has at least one cathode therein.

10. The wafer support device of claim 1, wherein a bottom surface of the lift pin rod abuts the topmost surface of the pad.

11. A wafer support device, comprising:
    a susceptor having a bottom surface and a top surface configured to support a wafer, the susceptor having at least one through hole extending between the bottom surface and the top surface, wherein the though hole includes a first end portion and a second end portion that is above the first end portion and that has a width less than a width of the first end portion and the first end portion of the through hole is defined by an inner sidewall of the susceptor;
    at least one lift pin including:
    a lift pin body telescopically received in the second end portion of the through hole of the susceptor;
    a lift pin rod coupled to the lift pin body, telescopically received in the first end portion of the through hole of the susceptor, and having a sidewall directly facing the inner sidewall of the susceptor, wherein a width of the lift pin rod is greater than the width of the second end portion of the through hole of the susceptor; and a lift pin holder configured to detachably connect the lift pin body to the lift pin rod;

at least one lift pin support base having top and bottom surfaces and at least one coupling feature that extends between the top and bottom surfaces of the lift pin support base, wherein the coupling feature of the lift pin support base and the through hole of the susceptor at least partially vertically overlap with each other, and the coupling feature is sized to allow the lift pin rod, the lift pin body, and the lift pin holder to pass therethrough; and at least one pad detachably covering the coupling feature of the lift pin support base, wherein a bottommost surface of the pad is above the bottom surface of the lift pin support base.

12. The wafer support device of claim 11, wherein the coupling feature of the lift pin support base has a diameter substantially equal to or greater than that of the lift pin.

13. The wafer support device of claim 11, wherein the coupling feature of the lift pin support base has a top portion and a bottom portion, the top portion is present between the susceptor and the bottom portion, and the top portion has a diameter greater than that of the bottom portion.

14. The wafer support device of claim 13, wherein the pad is at least partially received in the top portion.

15. The wafer support device of claim 13, wherein the diameter of the bottom portion is substantially equal to or greater than that of the lift pin.

16. The wafer support device of claim 11, wherein the lift pin holder is telescopically received in the first end portion of the through hole of the susceptor.

17. The wafer support device of claim 16, wherein the lift pin holder has a width greater than the width of the second end portion of the through hole of the susceptor.

18. A wafer support device comprising:

a susceptor configured to support a wafer thereon and formed with a through hole, wherein the through hole includes a first end portion and a second end portion that is above the first end portion and that has a width less than a width of the first end portion;

a lift pin rod configured to be received in the through hole in the susceptor and including a top that has a width less than a width of the through hole in a bottom surface of the susceptor;

a lift pin body configured to be received in the through hole in the susceptor;

a lift pin holder configured to detachably connect the lift pin body to the lift pin rod and to be received in the first end portion of the through hole of the susceptor and having a width greater than the width of the second end portion of the though hole of the susceptor; and a lift pin support base configured to support a bottom surface of the lift pin rod thereon and formed with a coupling feature, wherein the coupling feature is sized to allow the lift pin holder to pass therethrough.

19. The wafer support device of claim 18, wherein the width of the lift pin rod is less than a width of the coupling feature in the lift pin support base.

20. The wafer support device of claim 18, further comprising a pad detachably coupled to the coupling feature and has a T-shaped cross-section.

* * * * *